United States Patent [19]

Matsuda et al.

[11] Patent Number: 4,766,047

[45] Date of Patent: Aug. 23, 1988

[54] OPTICAL RECORDING MEDIUM AND OPTICAL RECORDING PROCESS USING SUCH MEDIUM

[75] Inventors: Hiroshi Matsuda, Yokohama; Masahiro Haruta, Funabashi; Hirohide Munakata, Yokohama; Yoshinori Tomita, Yokohama; Takashi Hamamoto, Yokohama, all of Japan

[73] Assignee: Canon Kabushiki Kaisha, Tokyo, Japan

[21] Appl. No.: 870,425

[22] Filed: Jun. 4, 1986

Related U.S. Application Data

[62] Division of Ser. No. 659,701, Oct. 11, 1984, abandoned.

[30] Foreign Application Priority Data

Oct. 14, 1983 [JP] Japan ................................ 58-190932
Oct. 14, 1983 [JP] Japan ................................ 58-190933
Oct. 14, 1983 [JP] Japan ................................ 58-190934

[51] Int. Cl.$^4$ ............................................. G03C 11/00
[52] U.S. Cl. ....................................... 430/19; 430/495; 430/967; 430/21; 369/108; 369/125
[58] Field of Search ................. 430/495, 19, 967, 330, 430/21; 369/108, 125

[56] References Cited

U.S. PATENT DOCUMENTS

| | | | |
|---|---|---|---|
| 3,723,121 | 3/1973 | Hauser | 96/27 |
| 4,235,958 | 11/1980 | Barraud et al. | 430/311 X |
| 4,314,021 | 2/1982 | O'Brien et al. | |
| 4,374,077 | 2/1983 | Kerfeld | 264/22 |
| 4,539,061 | 9/1985 | Sagiv | 156/278 |

FOREIGN PATENT DOCUMENTS 0077577 4/1983 European Pat. Off. ............ 430/270
2221378 5/1974 Fed. Rep. of Germany.

OTHER PUBLICATIONS

Bernd Tieke et al., "Topochemical Reactions in Langmuir-Blodgett Multilayers", *J. Macromol. Sci.—Chem.*, A15(5), pp. 1045-1058, (1981).

André Barrand et al., "Polymerized Monomolecular Layers: A New Class of Ultrathin Resins for Microlithography", *Thin Solid Films*, vol. 68, No. 1, (May, 1980), pp. 91-98.

*Primary Examiner*—John L. Goodrow
*Assistant Examiner*—Cynthia Hamilton
*Attorney, Agent, or Firm*—Fitzpatrick, Cella, Harper & Scinto

[57] ABSTRACT

An optical recording medium and an optical recording process using such a medium are provided. The optical recording medium comprises a photopolymerizable monomer having a hydrophilic group, a hydrophobic group, and at least one unsaturated bond in the molecule.

10 Claims, 1 Drawing Sheet

OPTICAL RECORDING MEDIUM AND OPTICAL RECORDING PROCESS USING SUCH MEDIUM

This is a division of application Ser. No. 659,701, filed Oct. 11, 1984, now abandoned.

BACKGROUND OF THE INVENTION

1. Field of the Invention

The present invention relates to an optical recording medium which comprises a photopolymerizable monomer and to an optical recording process using such a medium.

2. Description of the Prior Art

There have so far been known optical recording media which comprise films as recording layers formed from organic compounds; for example, such media are disclosed in Japanese Patent Application Laid-Open Nos. 16,948/81 and 125,246/83. Both of the disclosures relate to a recording media having a recording layer composed of an organic coloring matter for recording and reproducing information by use of laser beams.

The medium disclosed in the latter patent application laid-open gazette employs a recording layer formed from cyanine coloring matter represented by the general formula The recording layer is formed by applying a solution of the coloring matter in the thickness of up to 1000 Å, for example, about 300 Å, on a plastic substrate using a spinner coater or the like. When the molecular distribution or orientation in the layer is random, the incident light scatters in the layer and the extent of chemical reaction caused by light irradiation varies microscopically at every irradiation. In consequence, for recording media, the molecular distribution and orientation in the layer is desired to be uniform and the layer thickness is required to be minimized for the purpose of obtaining high-density recording. By coating methods, however, the lower limit of the layer thickness is about 300 Å and the random molecular distribution and orientation are inevitable.

Meanwhile, Japanese Patent Application Laid-Open Nos. 42,229/81 and 43,220/81 disclose that a built-up film of a diacetylene compound formerly proposed as one of resist materials that shows a high light quantum yield and has a superior resolution can also be applied to thin film electrooptic devices, electro-acoustic devices, and piezoelectric and pyroelectric devices, etc.

Recently an improved process for producing built-up films of diacetylene compounds is disclosed in Japanese Patent Application Laid-Open No. 111,029/83. Built-up films of diacetylene compounds produced according to these inventions are used for film-optic devices and integrated circuit elements, after the polymerization thereof by ultraviolet irradiation to form a polymer film or partial polymerization thereof by ultraviolet irradiation under masking and pattern formation by removing the unpolymerized portions.

However, these patent applications are all limited to diacetylene compounds and do not describe the possibility of erasing information once recorded when built-up films of a diacetylene compound are used for film-optic devices.

SUMMARY OF THE INVENTION

The primary object of the invention is to provide an optical high-density-recording medium which permits repetition of recording and erasing of information.

Another object of the invention is to provide an optical recording process using such a recording medium.

According to one aspect of the present invention, there is provided an optical recording process which uses a recording medium comprising a hydrophilic group, a hydrophobic group, and at least one unsaturated bond in the molecule.

According to another aspect of the present invention, there is provided an optical recording medium comprising a recording layer which is a monomolecular film or built-up film of monomolecular layers formed on a substrate, of a photopolymerizable monomer having a hydrophilic group, a hydrophobic group, and at least one unsaturated bond in the molecule.

According to further aspect of the present invention, there is provided an optical recording medium comprising a recording layer which is a built-up film of monomolecular layers formed on a substrate, of two or more kinds of photopolymerizable monomer having a hydrophilic group, a hydrophobic group, and at least one unsaturated bond in the molecule respectively.

DETAILED DESCRIPTION OF THE PREFERRED EMBODIMENTS

The objects of the invention are achieved with an optical recording medium comprising a recording layer which is a monomolecular film or built-up film of monomolecular layers formed of one or more kinds of photopolymerizable monomers on a substrated.

The photopolymerizable monomer of the invention is capable of forming a monomolecular film or a built-up film of monomolecular layers on a substrate. Recording layers for optical recording media can be produced by using these films.

In the optical recording medium of the invention, recording is accomplished by irradiating the photopolymerizable monomer of the recording layer with light signals of information to polymerize the irradiated portions of the monomer, thus forming a difference due to the polymerization between the irradiated and unirradiated portions. The reproduction can be carried out by various methods for measuring the difference caused by the polymerization. Further erasing of the recorded information is carried out by heating to depolymerize the polymer.

A wide variety of photopolymerizable monomers can be used as the compounds for optical recording media in the invention, so long as they have a hydrophilic group, a hydrophobic group, and at least one unsaturated bond in the molecule.

These photopolymerizable monomers can be represented by the general formula (IIa), (IIb), or (III):

$$R_1-CH=CH-R_2 \quad (IIa)$$

$$R_1-CH=CH-R_3-CH=CH-R_2 \quad (IIb)$$

$$R_1-C{\equiv}C-C{\equiv}C-R_2 \quad (III)$$

In the formulae (IIa) and (III), a hydrophilic site and a hydrophobic site are both present in $R_1$ or in $R_1$ and $R_2$, or $R_1$ is hydrophobic relative to $R_2$, that is, $R_2$ is hydrophilic relative to $R_1$. In the formula (IIb), a hydrophilic site and a hydrophobic site are both present in one of $R_1$, $R_2$, and $R_3$ or one of $R_1$, $R_2$, and $R_3$ is hydrophobic relative to the remainders and one of the remainders is hydrophilic. Particularly preferred photopolymerizable monomers in the invention have a $C_{10}$–$C_{30}$ long chain alkyl group in $R_1$, such two alkyl groups in $R_1$ and $R_2$ respectively, or such an alkyl group in at least one of $R_1$, $R_2$, and $R_3$.

Examples of the photopolymerizable monomer of the invention are given below.

(13)
(14)

(15)
(16)

(17)
(18)

(19)

(20)

(21)
(22)

(23)
(24)

(25)
(26)

(27)
(28)

(29)

(30)

(31)

(32)

(33)

(34)

(35)

(36)

(37) $CH_3—(CH_2)_x—C≡C—C≡C—(CH_2)_y—COOH$ (38)

(x and y denote each 0 or a positive integer and satisfy $10≦x+y≦30$)

In the above formulae; $R=—(CH_2)_nCH_3$; $X^⊖=Cl^-$, $Br^-$, $I^-$, $ClO_4^-$, or the like; and n=a positive integer.

The above photopolymerizable monomers are themselves known compounds [described in "Kagaku to Kogyo (Chemistry and Chemical Industry)", 32, No. 10, pp. 763–765] or are compounds analogous in structure thereto, except that long-chain alkyl groups are introduced therein. Accordingly, these monomers can be synthesized according to known processes. For example, 1,4-di-n-octadecyl-2,5-distyrylpyrazine perchlorate, (A)

which is a photopolymerizable olefin monomer having a $C_{18}$ long chain alkyl group (n-octadecyl group) can be prepared in the following way:

10.8 g of 2,5-dimethyl pyrazine and 44.5 g of n-octadecyl p-chlorobenzenesulfonate are dissolved in 100 ml of DMF and heated under reflux for 1 hour in an atmosphere of nitrogen. After cooling, a solution of 10 g of sodium perchlorate in 200 ml of water is added. The solid deposit is washed with ether and recrystallized from methanol. 4.7 g of the thus obtained 1,4-di-n-octadecyl-2,5-dimethyl pyrazine and 1.04 g of benzaldehyde are heated together in acetic anhydride under reflux for 3 hours. After cooling, A is obtained by recrystallization from methanol in a 40% yield. Other monomers of the invention can be prepared in similar ways.

The monomolecular film and the built-up film of monomolecular layers are formed according to, for example, the Langmuir-Blodgett's technique (LB method) developed by I. Langmuir et al. The LB method utilizes the fact that molecules having hydrophilic and hydrophobic groups in the molecule, wherein the lyophilic and lyophobic properties are suitably balanced, form a monomolecular layer on a water surface with hydrophilic groups thereof being directed downward. The monomolecular layer on a water surface has characteristics of a two-dimensional system. When molecules are sparsely scattered, there is the relation of two-dimensional ideal gas between the area A of the layer per one molecule and the surface pressure $\pi$:

$$\pi A = kT$$

wherein k is Boltzmann's constant and T is the absolute temperature of the molecules. Thus, the monomolecular layer is regarded as a "gaseous film". When the area A is decreased sufficiently, the molecular interaction is enhanced and the monomolecular layer becomes a "condensed film (or solid film)". The condensed film can be transferred layer by layer onto a substrate such as a glass plate. Using this method, the monomolecular film and the built-up film of monomolecular layers can be produced, for example, in the following way:

The photopolymerizable monomer is first dissolved in a solvent, and the solution is spread on a water surface to float the monomer in film form. In this case, a partition plate (or a float) is provided to restrict the free diffusion of the monomer on the water surface so as not to spread too far. Thus the aggregation state of the film-forming monomer is controlled to attain a surface pressure $\pi$ proportional to the degree of the aggregation. The surface pressure $\pi$ can be raised gradually to a suitable value for the formation of a built-up film by moving the partition plates to reduce the area of the spread monomer layer and controlling the aggregation state of monomer molecules in the layer. The monomolecular layer of the monomer can be transferred onto a clean substrate by a slow vertical movement thereof across the floating monomer layer while keeping the suitable surface pressure. The built-up film of monomolecular layers of the monomer having a desired built-up degree can be formed by repeating the above operation.

One or more kinds of molecules for constructing the film are selected from the above defined photopolymerizable monomers. When two or more photopolymerizable monomers are used, each monomolecular layer made of one kind of photopolymerizable monomer. Various combinations of monomolecular layers different in the kind of constituent molecule are possible for constructing the built-up film; for example, photopolymerizable monomers a and b can be built up in the sequence of $(ab)_n$, $(a_m b_l)_n$, or $a(b)_n$ (wherein n, m, and l are each a positive integer of 1 or more) from the substrate side or completely at random. The combination is chosen depending upon properties of the photopolymerizable monomers to be used and some other factors.

Suitable thicknesses of the recording layer are 30 Å–3 $\mu$m, particularly 100–3000 Å. Taking this into account, the photopolymerizable monomers to be used and the degree of built-up are chosen.

For transferring the monomolecular layer onto a substrate, the lifting method and the rotary cylinder method can also be applied besides the above vertical dipping method. The lifting method is a way of transferring a monomolecular layer onto a substrate by bringing the substrate into contact with a monomolecular layer on a water surface while keeping the substrate surface horizontal. The rotary cylinder method comprises rotating a cylindrical substrate on a monomolecular layer formed on a water surface, thereby transferring the monomolecular layer onto the substrate surface. In the vertical dipping method, the first monomolecular layer, on raising a substrate across the water surface, is formed on the substrate with the hydrophilic groups facing the substrate. One monomolecular layer is deposited by each vertical movement of the substrate. Orientations of molecules in the monomolecular layers transferred by raising the substrate and by sinking it are in the directions opposite to each other. Accordingly, the vertical dipping method gives a so-called Y-type of film in which hydrophilic groups or hydrophobic groups face one another between each two adjoining layers. In contrast to this, the lifting method, the way of transferring a monomolecular layer from a water surface onto a substrate by horizontal contact thereof with the layer, forms on a substrate a monomolecular layer in which hydrophobic groups face the substrate. According to this method, the alternate directional molecular orientation is not caused in the built-up film, and thus a so-called X-type of built-up film is formed, wherein hydrophobic groups in all the layers are directed toward the substrate. On the contrary, the built-up film wherein hydrophilic groups in all the layers are directed toward the substrate is called a Z-type of built-up film.

The rotary cylinder method is a way of transferring a monomolecular layer onto a cylindrical substrate surface by rotating the cylindrical substrate on a monomolecular layer formed a water surface. The method for transferring the monomolecular layer onto the substrate in the invention is not limited to the above stated methods. When large area substrates are employed, a roll of substrate is unwound to push forward the continuous substrate into water on which the monomolecular layer of the monomer has been formed. The above said directions of hydrophilic and hydrophobic groups, being merely in principle, can be changed by surface treatment of the substrate or other suitable methods.

On irradiation of the thus prepared optical recording medium with a pattern of light, such as $\gamma$-ray, X-ray, or ultraviolet ray, which is capable of supplying the energy necessary for the polymerization, the polymerization takes place as shown below in the irradiated sites when the monomer is represented by the formula (IIa).

Figure 1:
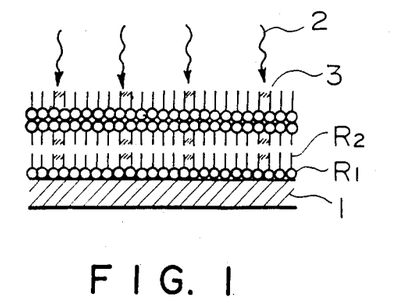
FIG. 1 is an illustration showing a recording layer of photopolymerizable monomer in the recording state of the optical recording medium according to the invention.

With a diacetylene compound represented by the formula (III), the polymerization takes place as shown by the following equation:

These reactions can be caused when the distance between adjacent unsaturated bonds is 4 Å or less. That is, such a polymerization can take place between adjacent molecules in the same layer of the monomolecular film or of the built up film prepared as stated above as well as between adjacent molecules in adjacent layers facing each other of the built-up film. The polymer does not depolymerize in the dark and the monomer in the unirradiated sites remains unpolymerized. Thus, recording is accomplished in accordance with the pattern of light as shown in FIG. 1.

Figure 2:
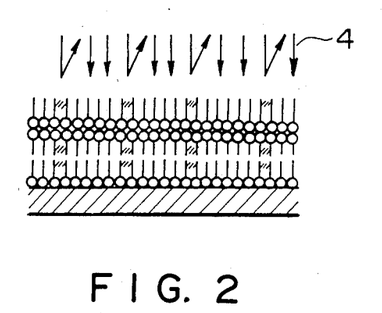
FIG. 2 is an illustration showing the recording layer in the state of reading out recorded information.

Recorded information can be read out, for example, by visible ray irradiation. Since some conjugated bonds in the monomer are lost by the polymerization, a change has occurred in the visible ray absorption spectrum of the irradiated sites. That is, since the absorption maximum has shifted to the shorter wavelength side, the information is read out by measuring the change in the absorption spectrum (FIG. 2). Therefore, a longer conjugation system will leads to a larger difference in maximum absorption wavelengths between the monomer and the polymer, resulting in easier reproduction.

Recorded information can also be read out by observing, besides the change in the visible ray absorption spectrum, the volume change between the monomer and the polymer according to the schlieren method. This method is specially suited to monomolecular films of monomers in which a larger volume change is caused on polymerization. The reading of recorded information is also possible, when the monomolecular film or the built-up film of monomolecular layers is formed not directly on the substrate but on a photoconductive layer of Se, ZnO, or CdS formed on the substrate, by an electrical detection of the difference in light absorbance between the monomer and the polymer.

Figure 3:
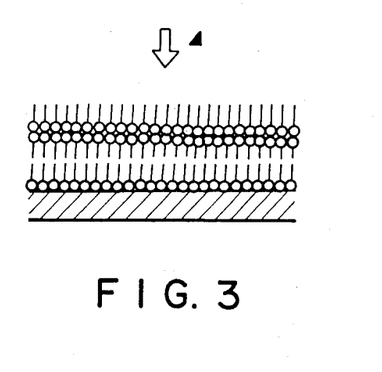
FIG. 3 is an illustration showing the recording layer from which the recorded information is erased.

Erasing of recorded information is accomplished by heating the medium at a temperature, e.g. of 300°–450° C., to depolymerize the polymer (FIG. 3). While this heating causes a degradation of the recording layer, the optical recording medium can be used repeatedly up to about 100 times.

The substrate on which the monomolecular film or the built-up film of monomolecular layer of the monomer is formed in the invention is not particularly limited. However, the surface of the substrate needs to be clean since a surface active substance adhering the substrate surface disorders the monomolecular film during the transfer thereof from a water surface, resulting in inferior monomolecular film or built-up film. Suitable materials for the substrate include, for example, glass, metals such as aluminum, plastics, and ceramics.

While the monomolecular film or the built-up film of monomolecular layers is sufficiently firmly fixed on the substrate and hence scarcely peels off the substrate, a bond layer can be laid between the substrate and the film for the purpose of more enhancing the adhesion. The adhesion can also be enhanced by suitable selection of conditions of monomolecular layer formation, for example, the concentration of hydrogen ions in the aqueous phase, species of ions, and the surface pressure.

Formation of a protective film on the monomolecular film or the built-up film of monomolecular layers is favorable for the purpose of improving the chemical stability of the film, but the protective film is not always necessary depending upon the monomer to be used.

The invention is illustrated in more detail with reference to the following preparation and application examples.

EXAMPLE 1

A quaternary salt $\underline{A}$ prepared by introducing an n-octadecyl group on the pyrazine ring of 2,5-distyrylpyrazine was used as monomer for film formation. While keeping the surface pressure constant, the monomolecular film and built-up films of 5, 10, 20, 30, 50, 70, and 100 monomolecular layers were transferred on clean hydrophilic surfaces of glass substrates according to the vertical dipping method, thereby preparing optical recording media. In the formed films, the monomer molecules oriented with the pyrazine rings directing toward the substrate.

Optical recording media thus prepared were irradiated with an X-ray according to a pattern to cause the polymerization as shown in the following equation (VI), thereby recording information.

(perchlorate ions dissolve in the water during formation of the film).

Using these optical recording media, particularly those having built-up films of 5–70 monomolecular layers, high density recording of the order of molecular dimensions could be achieved.

Information recorded in these recording media could be read out with high S/N ratios by using a beam of visible light having a wavelength of 420 nm.

The information recorded in these optical recording media was erased by heating the media to 300° C. Then, information was recorded again in the media by X-ray irradiation according to a pattern.

Thus, high density recording of the order of molecular dimensions was possible with the optical recording media and that repeatedly.

EXAMPLE 2

Using compound B:

as a monomer for film formation, the same operation as in Example 1 for transferring a monomolecular film onto each of substrates was repeated to prepare built-up films of 10, 20, 50, 100, 200, 300, 400, and 500 monomolecular layers.

Optical recording thus media prepared were irradiated with ultraviolet rays according to a pattern to cause polymerization at the irradiated sites, thereby recording information.

Information recorded in the media could be read out successfully, particularly from built-up films of 10 to 100 monomolecular layers, by detecting the specific volume difference between the monomer and the polymer according to a schlieren method.

In addition to high density recording and good reproduction, repeated use of the optical recording media was possible similarly to those of Example 1.

EXAMPLE 3

In the same manner as in Example 1, optical recording media were prepared by using photopolymerizable monomers shown in Table 1.

TABLE 1

| Photopolymerizable monomer for forming the film | Number of monomolecular layers in built-up film |
|---|---|
| $C_{18}H_{37}-\overset{\oplus}{N}\bigcirc-CH=CH-\bigcirc-CH=CH-\bigcirc N$ | 5 |
| $\bigcirc^N-CH=CH-\bigcirc^N\!\!\!\!\underset{\underset{C_{18}H_{37}}{\mid}}{_{N\oplus}}-CH=CH-\bigcirc^N$ | 10 |
| $\bigcirc-CH=CH-(CH_2)_{17}-COOH$ | 10 |
| $\bigcirc-CH=CH\underset{\underset{C_{18}H_{37}}{\mid}}{\overset{N\oplus}{\bigcirc}}CH=CH-\bigcirc$ | 10 |
| $CH_3-O-\overset{O}{\underset{\|}{C}}-CH=CH\overset{\bigcirc}{N}CH=CH-\overset{O}{\underset{\|}{C}}-O-C_{18}H_{37}$ | 20 |
| $CH_3-O-\overset{O}{\underset{\|}{C}}-CH=CH\underset{\underset{C_{18}H_{37}}{\mid}}{\overset{N\oplus}{\bigcirc}}CH=CH-\overset{O}{\underset{\|}{C}}-O-CH_3$ | 20 |
| $CH_3-(CH_2)_{11}-C\equiv C-C\equiv C-(CH_2)_8-COOH$ | 20 |

Recording and reproducing tests were conducted on the optical recording media thus prepared by using the rays shown in Table 2. With all the media, high density recording of the order of molecular dimensions was possible and these media could be used repeatedly by heating them after recording, similarly to Example 1.

TABLE 2

| Photopolymerizable monomer for forming the film | Writing Ray | Reading method |
|---|---|---|
|  | UV-rays | Visible ray (λ = 450 nm) Schlieren method |
|  | X-ray | Visible ray (λ = 450 nm) Schlieren method |
|  | UV-rays | Visible ray (λ = 420 nm) Schlieren method |
|  | X-ray | Visible ray (λ = 460 nm) Schlieren method |
|  | X-ray | Schlieren method |
|  | X-ray | Schlieren method |
| $CH_3-(CH_2)_{11}-C\equiv C-C\equiv C-(CH_2)_8-COOH$ | X-ray | Schlieren method |

EXAMPLE 4

Built-up films of monomolecular layers were formed on glass substrates by using the following monomers C and D in combination as film components.

A solution of C in chloroform was extended on a water surface to form a monomolecular layer of C thereon. Similarly a solution of D in chloroform was extended on a water surface in another vessel, to form a monomolecular layer of D. While keeping the surface pressure constant, a glass substrate having a sufficiently cleaned and hydrophilic surface was gently sunk into the C-supporting water and a part of the monomolecular film of C was transferred onto the substrate. Then the substrate was sunk into the D-supporting water and a part of the monomolecular film of D was transferred onto the monomolecular film already transferred onto the substrate. By repeating these transfer operations, optical recording media having recording layers of 50–3000 Å in thickness were prepared.

Information was recorded in the optical recording media thus prepared, by X-ray irradiation according to a pattern. Recorded information could be read out with high S/N ratios in particular from the recording layers 300–3000 Å thick by using a visible ray of wavelength 420 nm.

These recording media were heated to 350° C. to remove recorded information, and were subjected again to X-ray pattern irradiation to record information.

Thus, high density recording of the order of molecular dimensions was possible with the optical recording media and that repeatedly.

EXAMPLE 5

In the same manner as in Example 4, optical recording media were prepared by using the combination of photopolymerizable monomers shown in Table 3.

Recording and reproducing tests were conducted on the optical recording media thus prepared, by using the rays shown in Table 3. With all the media, high density recording of the order of molecular dimensions was possible and these media could be used repeatedly by heating them after recording, similarly to Example 4.

TABLE 3

| Photopolymerizable monomer for forming the film | Film structure | Schematic diagram of film structure | Writing ray | Reading method |
|---|---|---|---|---|
|  | Lower 5 layers (substrate side) consisted of E. |  5 layers | X-ray | Visible ray λ = 420 nm |
|  | Upper 5 layers consisted of F. |  5 layers | | |
| | 10 layers in all. | Substrate | | |
| E and F | Lower 10 layers consisted of E. |  10 layers | X-ray | Visible ray λ = 420 nm |
| | Upper 10 layers consisted of F. |  10 layers | | |
| | 20 layers in all | Substrate | | |
| E and F | E and F layers were cumulated alternately in that order from the substrate side. |  20 layers | X-ray | Visible ray λ = 420 nm Schlieren method |
| | 20 layers in all. | Substrate | | |
|  | Lower 10 layers consisted of G. |  10 layers | X-ray | Visible ray λ = 450 nm |
|  | Upper 10 layers consisted of H. |  10 layers | | |
| | 20 layers in all. | Substrate | | |
| G and H | Lower 10 layers consisted of H. |  10 layers | X-ray | Visible ray λ = 450 nm |
| | Upper 10 layers consisted of G. |  10 layers | | |
| | 20 layers in all. | Substrate | | |

What is claimed is:

1. An optical recording process which comprises, in sequence, the steps of:
    (a) irradiating a recording medium having a recording layer comprising a monomolecular Langmuir-Blodgett film or a built-up monomolecular Langmuir-Blodgett film of a photopolymerizable monomer having a hydrophilic group, a hydrophobic group and at least one unsaturated bond in the molecule with information signals sufficient to polymerize the irradiated portion of the photopolymerizable monomer, thus forming recorded information corresponding to the polymerized portion of the monomer; and (b) erasing the recorded information by depolymerization of the polymerized portions of the monomer.

2. The optical recording process of claim 1, wherein the photopolymerizable monomer is represented by the general formula $$R_1-CH=CH-R_2$$

wherein $R_1$ and $R_2$ are each a hydrophilic moiety or a hydrophobic moiety, provided that when both $R_1$ and $R_2$ have hydrophilic or hydrophobic moieties, at least one of $R_1$ and $R_2$ has both a hydrophobic group and a hydrophilic group.

3. The optical recording process of claim 1, wherein the polymerizable monomer is represented by the general formula $$R_1-CH=CH-R_2-CH=CH-R_1$$

wherein $R_1$ and $R_2$ are each a hydrophilic moiety or a hydrophobic moiety, provided that when both $R_1$ and $R_2$ have hydrophilic or hydrophobic moieties, at least one of $R_1$ and $R_2$ has both a hydrophobic group and a hydrophilic group.

4. The optical recording process of claim 1, wherein the photopolymerizable monomer has at least one unsaturated bond and at least one $C_{10}$-$C_{30}$ long chain alkyl group.

5. The optical recording process of claim 1, wherein said recording layer is irradiated with gamma rays, X-rays, or ultraviolet rays.

6. The optical recording process of claim 1, wherein said depolymerization is caused by heating.

7. The optical recording process according to claim 6, wherein said layer is heated to a depolymerization temperature within a range from 300° C. to 450° C.

8. The optical recording process according to claim 1, including the step of reading out the recorded information by visible ray irradiation.

9. The optical recording process according to claim 1, including the step of reading out the recorded information by detecting the volume change between the non-polymerized portions and the polymerized portions of the monomer employing the Schlieren technique.

10. The optical recording process according to claim 1, including the step of reading out the recorded information by electrically detecting the difference in light absorption between the non-polymerized portions and the polymerized portions of the monomer.

* * * * *